United States Patent [19]
Lee

[11] Patent Number: 6,103,546
[45] Date of Patent: Aug. 15, 2000

[54] METHOD TO IMPROVE THE SHORT CIRCUIT CURRENT OF THE POROUS SILICON PHOTODETECTOR

[75] Inventor: Ming-Kwei Lee, Kaohsiung, Taiwan

[73] Assignee: National Science Council, Taipei, Taiwan

[21] Appl. No.: 09/041,679

[22] Filed: Mar. 13, 1998

[51] Int. Cl.[7] .................................................. H01L 31/18

[52] U.S. Cl. .............................. 438/57; 438/73; 438/466; 438/705; 136/261

[58] Field of Search .............................. 438/4, 466, 705, 438/960, 974, FOR 103, FOR 434, FOR 457, FOR 496, 57, 73; 136/261

[56] References Cited

U.S. PATENT DOCUMENTS 5,478,757  12/1995  Lee .
5,627,081  5/1997  Tsuo et al. .

*Primary Examiner*—George Fourson
*Assistant Examiner*—Joannie A. Garcia
*Attorney, Agent, or Firm*—Birch, Stewart, Kolasch & Birch, LLP

[57] ABSTRACT

The rapid thermal oxidation (RTO) and rapid thermal annealing(RTA) were used to improve the photo-current and photoresponsivity of porous silicon photodetector. In addition, we remove the surface oxide of the porous silicon under the metal grid using the same mask, and enhance the photo-current of porous silicon photodetector at zero bias voltage. This invention removes the limitation of application of the porous silicon photodetector.

4 Claims, 5 Drawing Sheets

METHOD TO IMPROVE THE SHORT CIRCUIT CURRENT OF THE POROUS SILICON PHOTODETECTOR

BACKGROUND OF THE INVENTION

1. Field of the Invention

A method for improving the short-circuit-current of porous silicon photodetector, which entails utilizing rapid thermal oxidation, rapid thermal annealing, and hydrofluoric acid to remove the oxidized layer on the porous silicon surface under the metal grid that serves to improve the photoresponsivity at zero bias and the stability of porous silicon photodetector.

2. Background of the Invention

Photodetector is a component used to convert light signals into electronic signals, and has been widely used in fields of communication, calculators, control, and medicine. The production method is simple, conversion of light to electronic signal is highly efficient and at a low cost. Furthermore, the photodetector with its high stability is widely demanded by the market. There are five advantages in applying porous silicon in photodetectors:

(1) Because of direct energy gap, conversion of light to electronic signal is highly efficient.

(2) It comes with a variety of wire diameters which means the material possesses multiple energy gaps that serve better quantum efficiency for lights of short wavelengths.

(3) Porous surface may enhance the absorption of light.

(4) Because of its avalanche effect it has high gain.

(5) The production method is simple and economical, hence it indicates that porous silicon is a good light-sensitive material.

Up until now, this type of photodetector still has a few drawbacks; for example, (a) Porous photodetectors is unstable.

(b) Porous photodetector's photo-current, and light sensitivity are not high enough.

(c) Photodetector's dark current is not low enough.

(d) The photo-current under zero bias voltage is not high enough.

that limits the application of a porous silicon photodetector.

DESCRIPTION OF THE RELATED ART

Porous silicon is different from the bulk silicon. According to 1990 the paper published by L. T. Canham in *Appl. Phys. Lett.*, Vol. 57, p. 1046, after the silicon surface has been electrically dissolved in the hydrofluoric acid solution to form porous silicon, the energy gap undergoes a zone-folding effect and changed from indirect energy gap to direct energy gap, which increase the light/ electronic converting efficiency of the silicon, thus the light quantum efficiency increases. In the mean time, the energy gap also increases due to quantum confinement; there is a non-linear relationship between the energy gap and the width of the wire diameter, which means the smaller the radius, the larger the corresponding energy gap. Thereafter in 1992, the paper published by G. D. Sander et. al. in *Appl. Phys. Lett.*, Vol. 60, p. 2525 regards that wire size tends to have a distributed range in terms of the dimension, and different wire diameters correspond to different energy gaps. Therefore, porous silicon is essentially made of a combination of semi-conductors with different energy gaps, thus it has a wider spectrum width in light absorption, and may eliminate secondary light reflection, hence it increases the rate of absorption for lights. Without adding an anti-reflection film, the photo-current and light sensitivity can be enhanced.

Furthermore, porous silicon's wire sizes are fairly small and they are absolutely in a complete depletion. In some parts, there may be avalanche generated under negative bias voltage that amplifies that light signal and become a high-efficient photodetector.

In general, the manufacturing method of using porous silicon to produce the photo detector consists of:

(1) Cleaning the silicon wafer throughly before coating a layer of aluminum as on its back, and upon annealing, the ohmic contact is formed, and then a layer of black wax is applied as a protection;

(2) The conditions for forming porous silicon entail the current density at 20 mA/cm$^2$, with a concentration of 5% hydrofluoric acid, and after 15 minutes of anodic etching time, the black wax is removed.

(3) The front side of silicon wafer is coated with aluminum; its structure is shown in FIG. 1.

(4) The sample is cut into 5×5 cm$^2$ before using TO-5 for sealing to complete a porous silicon photodetector.

Porous silicon photodetector manufactured through this method is found to have several shortcomings, such as unstable optical and electric characteristics, insufficient light sensitivity, insufficient low dark-current, and insufficient photo-current at zero bias voltage, which also implies insufficient short-circuit photo-current, hence the application range for porous silicon photodetector is somewhat limited.

According to 1992 the paper published by V. Petrova-Koch et. al in *Appl. Phys. Lett.*, Vol. 60, p. 943, the key factor stems from imperfect native oxides throughout the surface of porous silicon. Yet in 1993, the paper published by J. Yan et. al. in *Appl. Phys. Lett.*, Vol. 64, p. 1348, note that the porous silicon surface also contains unstable hydrogen-pasivated surface as they tend to form a recombination centers that would reduce the life time of the carriers, which further reduces the porous silicon photodetector's photo-current and light sensitivity, and causes instability to porous silicon photodetector.

SUMMARY OF THE INVENTION

Problems to be Resolved

Rapid thermal oxidation and rapid thermal annealing are utilized to improve the stability of porous silicon photodetector, enhance porous silicon photodetector's photo-current and light sensitivity, and reduce dark-current of the photodetector at the same time. In addition, hydrofluoric acid is used to remove the oxidized layer on the surface of the porous silicon under the metal grid so as to improve the porous silicon photodetector's photo-current response at zero bias voltage, and expand the application of porous silicon photodetector.

Summary of the Invention

The objective of this invention concerns utilizing rapid thermal oxidation and rapid thermal annealing to reduce recombination centers, hence improving the porous silicon photodetector's photo-current and light sensitivity. Furthermore, hydrofluoric acid is used to remove the oxidized layer on the surface of porous silicon under the metal grid to further improve the porous silicon photodetector's photo-current response at zero bias voltage in order to achieve a wider application range for porous silicon photodetector.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWING

The present invention will become more fully understood from the detailed description given hereinbelow and the accompanying drawings which are given by way of illustration only, and thus are not limitative of the present invention, and wherein:

FIG. 1(a) Side view of the structure

FIG. 1(b) Front view of an aluminum metal grid

101 . . . incident light

102 . . . Aluminum finger pattern

103 . . . Porous silicon

104 . . . Silicon

105 . . . Aluminum ohmic contact

Figure 2A:
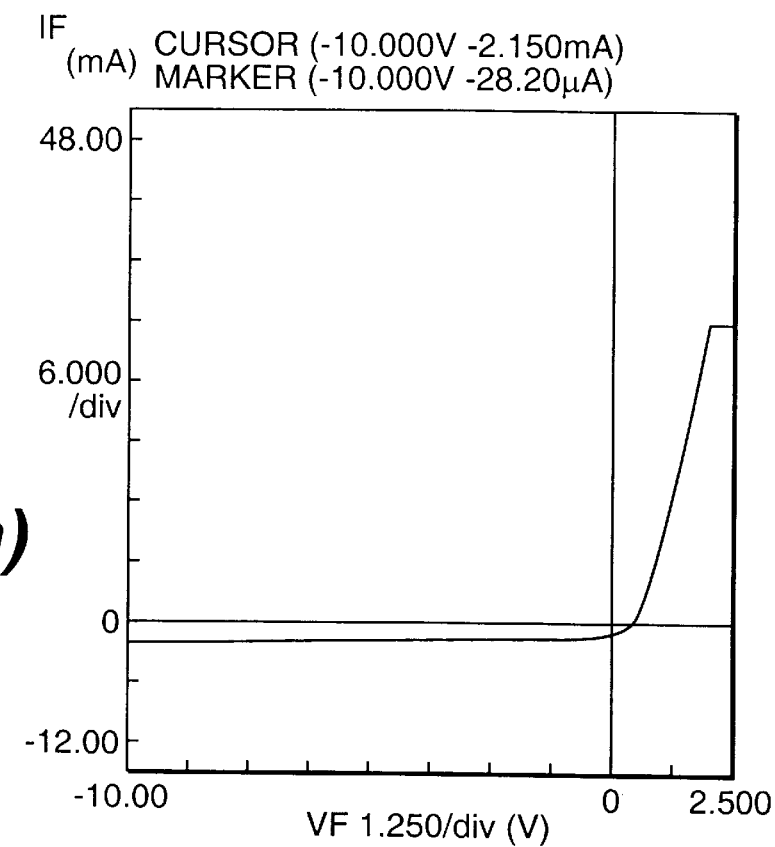
Figure 2B:
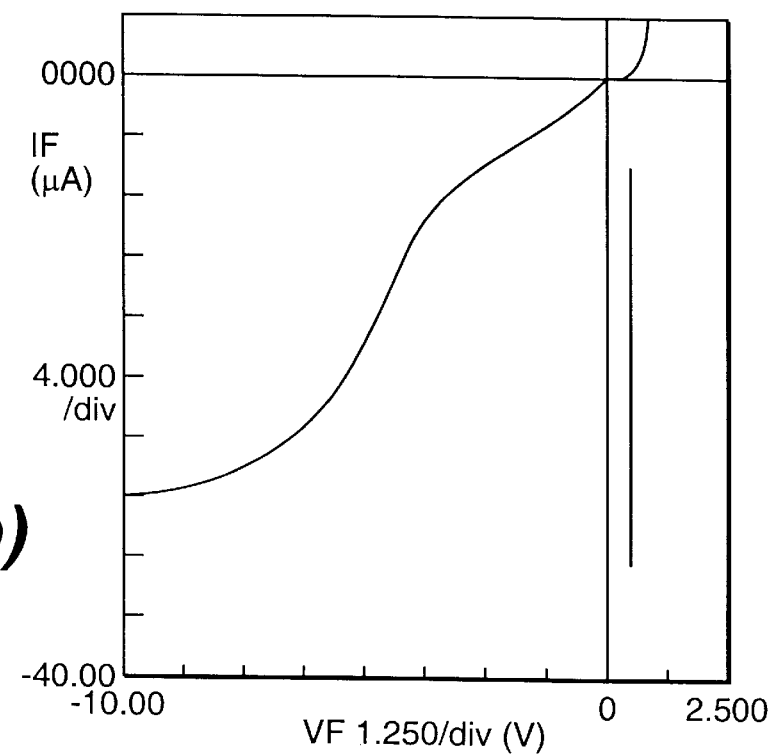

FIGS. 2(a)–(b) current-voltage characteristics for a as-grown porous silicon detector.

FIG. 2(a) Photo-current of current-voltage characteristics for a as-grown porous silicon detector.

Under −10 volts of bias voltage, the photo-current is 2.15 mA.

FIG. 2(b) Dark-current of current-voltage characteristics for a as-grown porous silicon detector.

Under −10 volts of bias voltage, the dark current is 28.2 $\mu A$.

Figure 3A:
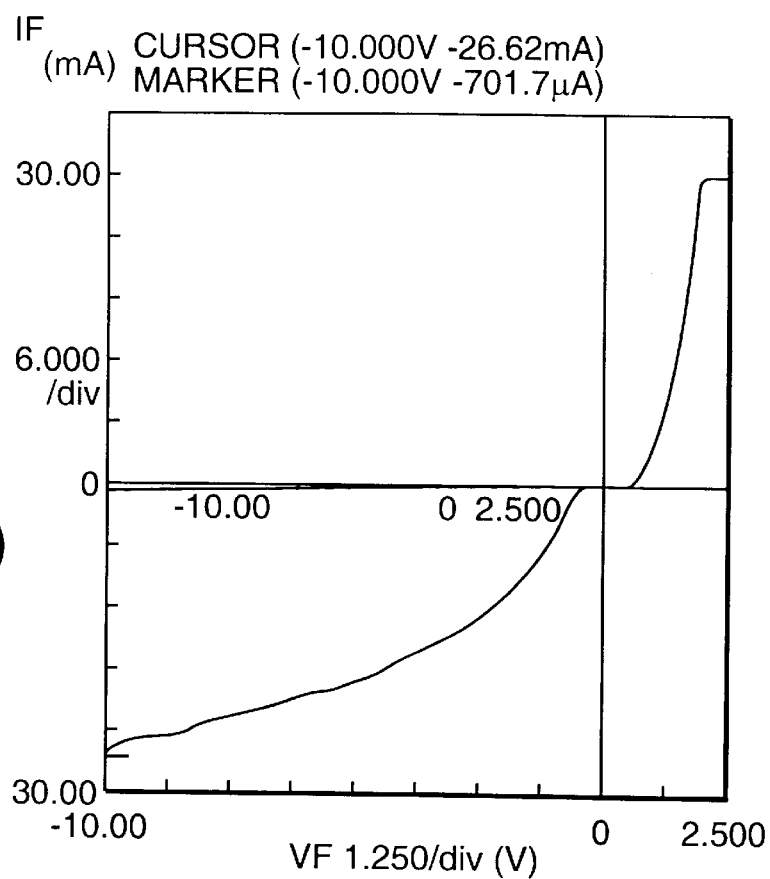
Figure 3B:
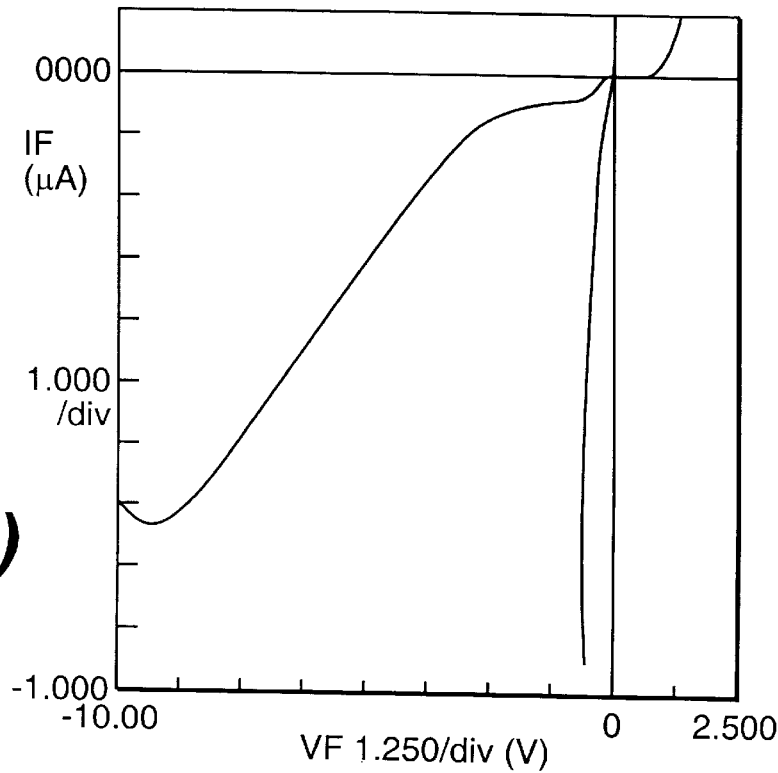

FIGS. 3(a)–(b) current-voltage characteristics for an improved porous silicon photodetector that has been processed with rapid thermal oxidation processing.

FIG. 3(a) photo-current of current-voltage characteristics for an improved porous silicon photodetector that has been processed with rapid thermal oxidation processing.

Under −10 volts of bias voltage, the photo-current has been improved substantially to reach −26.6 mA.

FIG. 3(b) Dark current of current-voltage characteristics for an improved porous silicon photodetector that has been processed with rapid thermal oxidation processing.

Under −10 volts of bias voltage, the dark current is somewhat inferior at 701.7 $\mu A$.

Figure 4A:
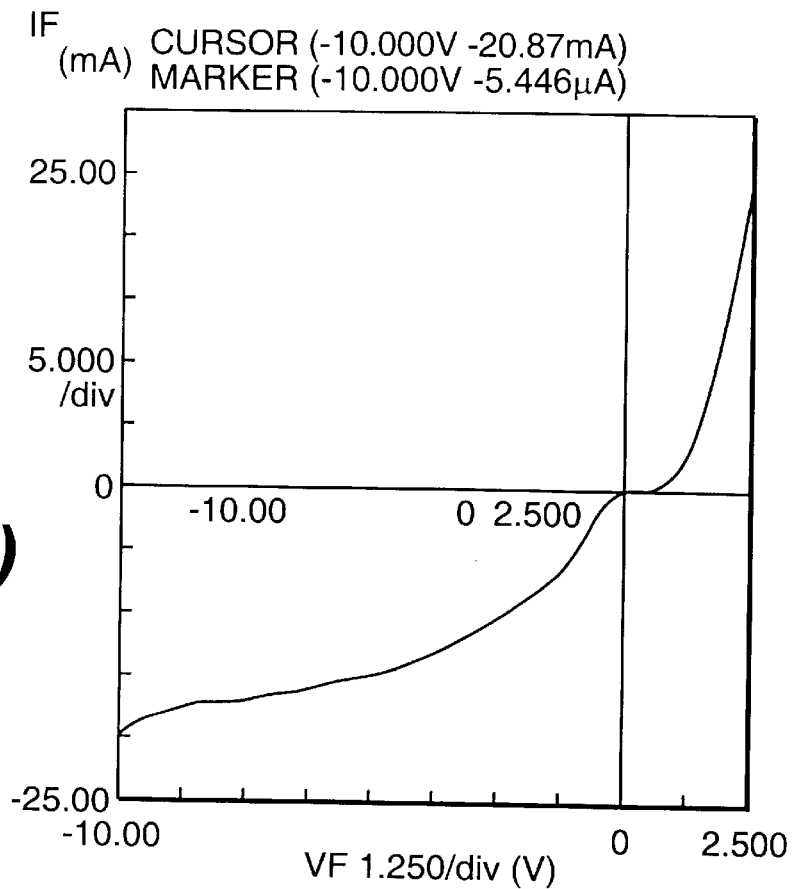
Figure 4B:
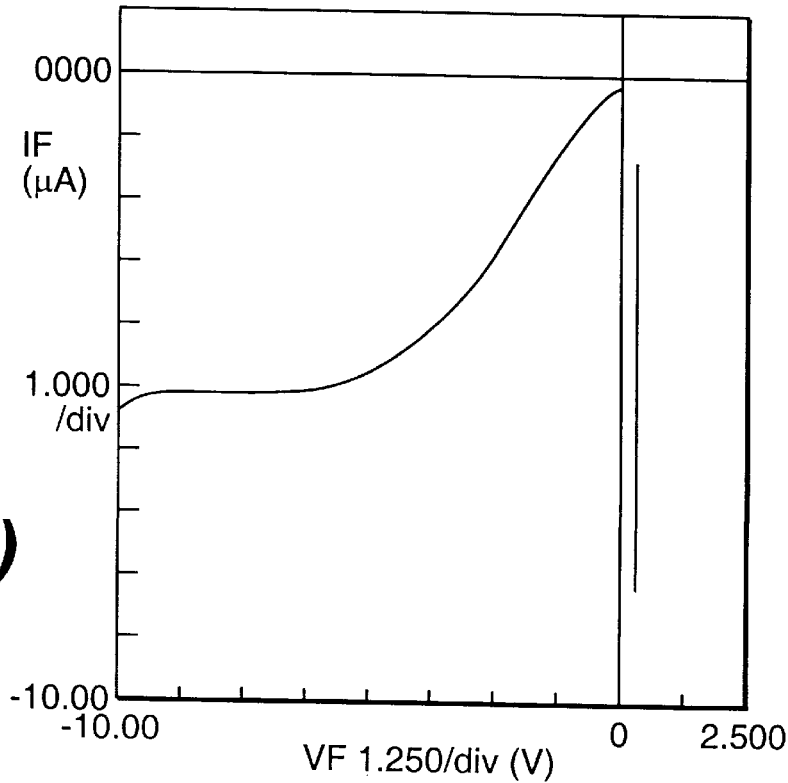

FIGS. 4(a)–(b) current-voltage characteristics for a as-grown porous silicon photodetectors that has been processed with rapid thermal oxidation and rapid thermal annealing.

FIG. 4(a) photo-current of current-voltage characteristics for a as-grown porous silicon photodetectors that has been processed with rapid thermal oxidation and rapid thermal annealing.

Under −10 volts of bias voltage, the photo-current is slightly reduced from that of FIG. 3, but has improved substantially from that of FIG. 2 to reach 20.8 mA.

FIG. 4(b) Dark current of current-voltage characteristics for a as-grown porous silicon photodetectors that has been processed with rapid thermal oxidation and rapid thermal annealing.

Under −10 volts of bias voltage, the dark current has the dark-current has drastically improved to as low as 5.4 $\mu A$.

Figure 5:
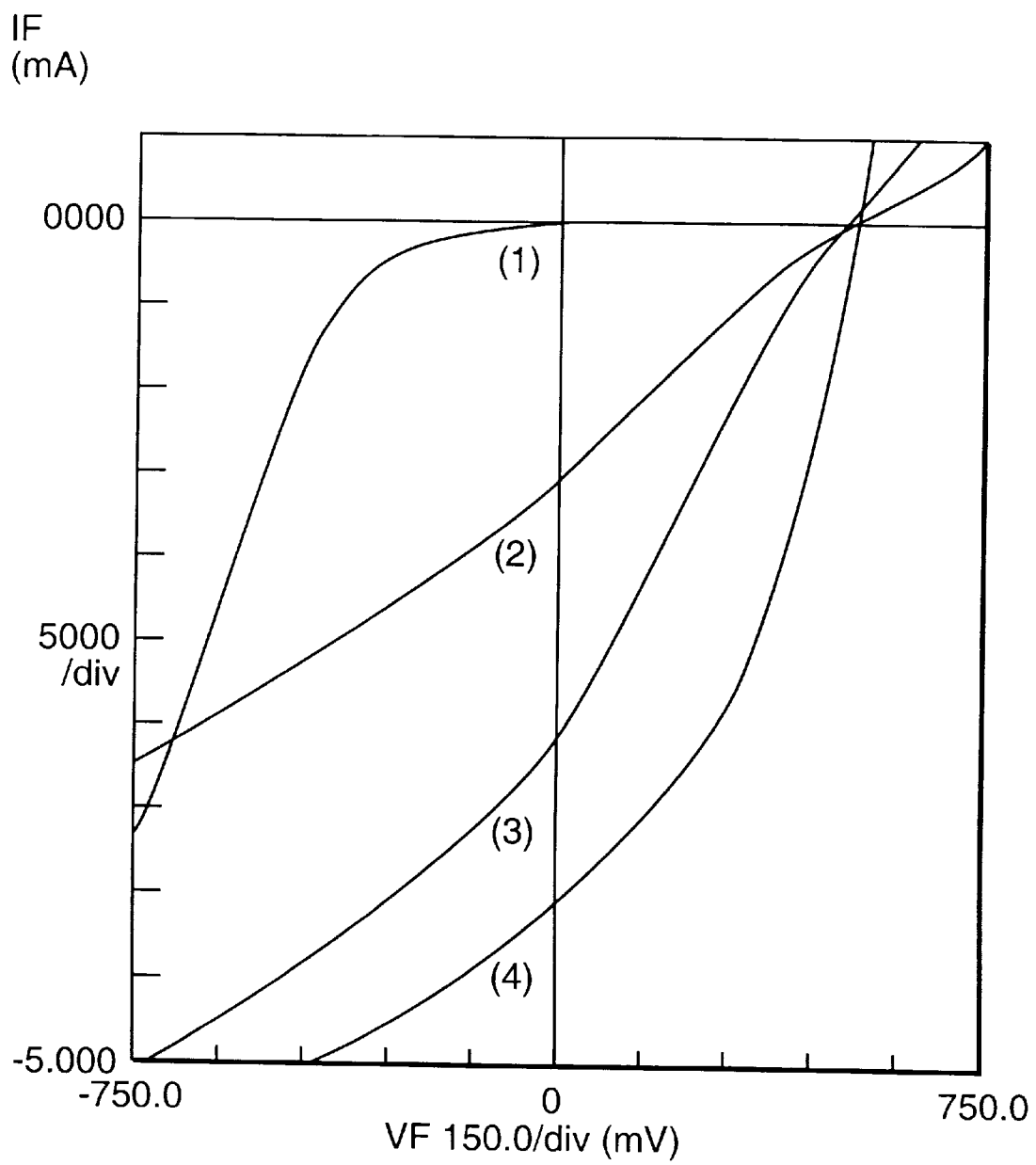

FIG. 5 Upon removing the oxidized layer with 5% hydrofluoric acid from the porous silicon photodetector's porous silicon surface under the metal grid, it further improves the porous silicon photodetector's short-circuit photo-current and open-circuit voltage at zero bias voltage.

Various curves shown in the drawings indicate the result of using different intervals for removing the oxidized layer (i) 0 second, (ii) 30, (iii) 50, and (iv) 70 seconds.

In particular, the fourth(iv) quadrant has a short-circuit photo-current of 4 mA, and its open-circuit voltage reaches 0.52 V.

(1) 0 second for removing oxidized layer.
(2) 30 seconds for removing the oxidized layer.
(3) 50 seconds for removing the oxidized layer.
(4) 70 seconds for removing the oxidized layer.

DESCRIPTION OF THE PREFERRED EMBODIMENT

This is an invention of a technique used to improve the stability of the porous silicon photodetector; it comprises of (1) a rapid thermal oxidation to increase the life time of the carriers, and to improve porous silicon detector photo-current and light sensitivity; (2) rapid thermal annealing method is utilized to enhance the porous silicon photodetector's excellent photo-current response and achieve a very low dark-current; (3) hydrofluoric acid is used to remove the oxidized layer on the surface of porous silicon under the metal grid in order to improve porous silicon photodetector's photo-current response at zero bias voltage.

Therefore, the process of this invention for "a technique in improving the stability of a porous silicon photodetector" entails, (1) Cleaning the silicon wafer thoroughly, and coating its back with aluminum plating; upon annealing, an ohmic contact is conducted, and then a layer of black wax is applied as a protection.

(2) To form porous silicon, current density of 20 mA/cm² is used, with 5% hydrofluoric acid, for 15 minutes of anodic etching time before removing the black wax. After which, it is placed under 850° C. for 90 seconds to achieve rapid thermal oxidation, and then under 850° C. for 15 seconds to achieve rapid thermal annealing process.

In addition, a photolithography technique is deployed, with the mask for the metal grid of the porous silicon photodetector used as a mask and Shipley MA1300 photoresist, as well as 5% hydrofluoric acid, intervals of 0~70 seconds are used to remove the porous silicon photodetector's oxidized layer on the porous silicon surface under the metal grid.

(3) The front of the silicon wafer is coated with aluminum plating.

(4) The sample is cut to a size of 5×5 cm², and sealed with TO-5 to complete a porous silicon photodetector.

Figure 1A:
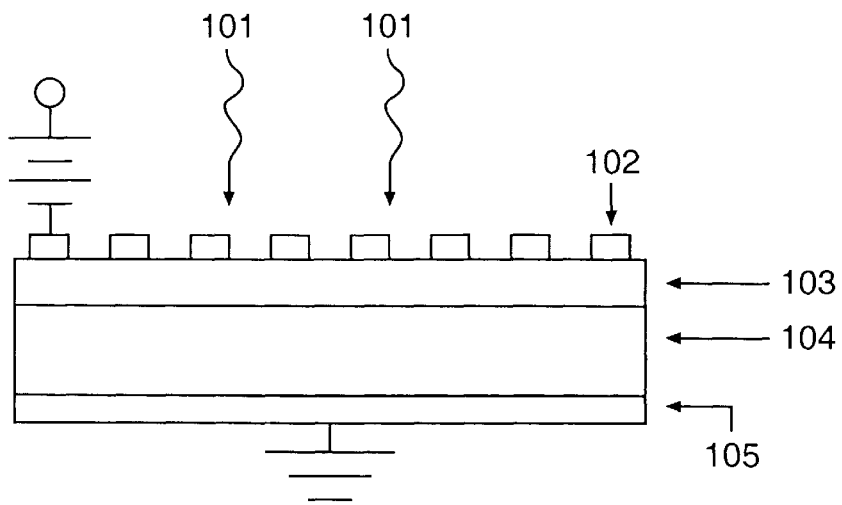
FIGS. 1(a)–(b) The structure of a porous silicon photodetector
Figure 1B:
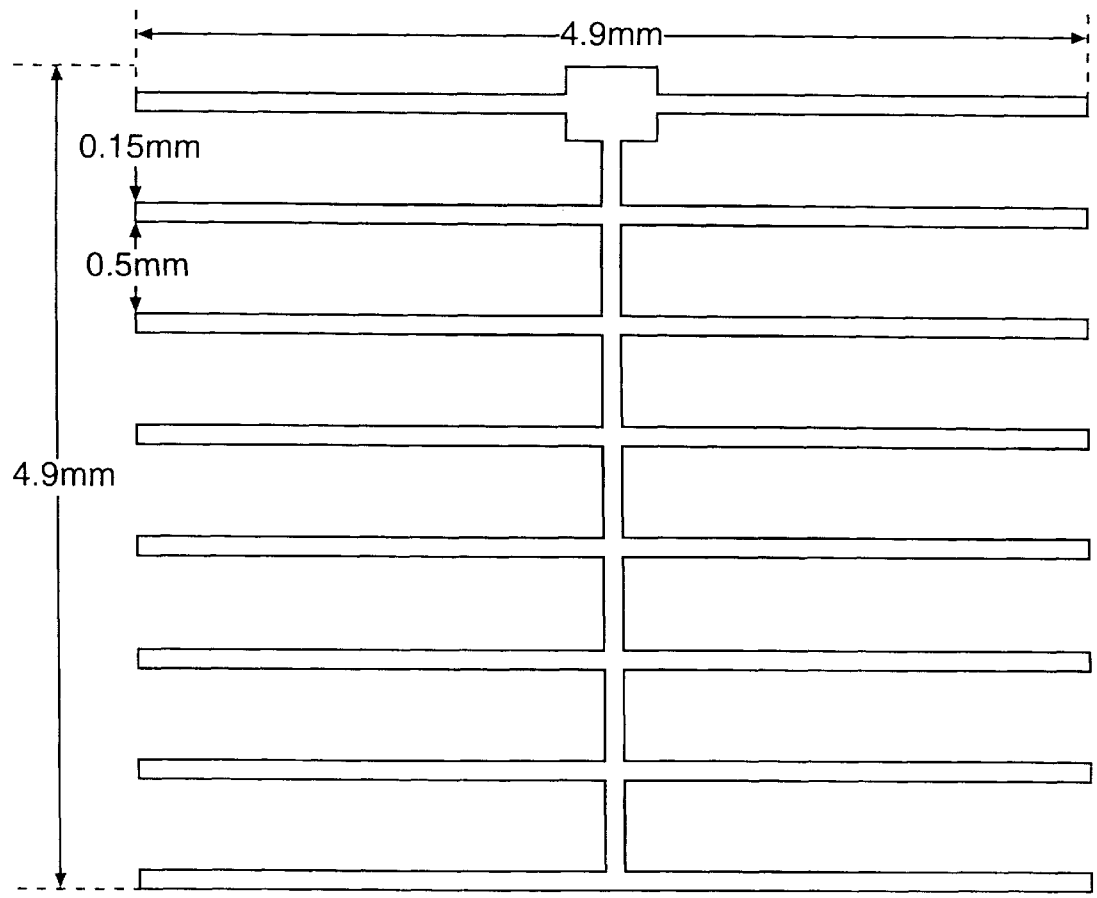

Methods deployed in generally known production of porous silicon photodetector tend to use 20 mA/cm² current density, 5% hydrofluoric acid for 15 minutes of anodic etching to produce porous silicon; the structure for this type of porous silicon photodetector is shown in FIG. 1. It does not involve any rapid thermal oxidation or rapid thermal annealing, thus the porous silicon surface tends to be filled with imperfect native oxide, and unstable hydrogen-passivated surface to form recombination centers, which reduce the life time of the carriers, which reduces the photo-current and light sensitivity of the porous silicon photodetector. This type of porous silicon photodetector is naturally unstable. The photo-current and dark-current of current voltage curve of a porous silicon photodetector at 10 volts of reversed bias voltage shown as FIG. 2, whether photo-current is 2.15 mA, yet the dark-current is 28.2 $\mu A$.

This shortcoming improved through rapid thermal oxidation (RTO). The rapid thermal oxidation proposed in this invention not only replaces unstable oxide with stable oxide, but also eliminates unstable hydrogen-passivated surface. Therefore, increasing the carriers' life time, and improves porous silicon photodetector's photo-current and light sensitivity. Common technique used in forming porous silicon photodetector entails using 20 mA/cm$^2$ current density, with 5% hydrofluoric acid for 15 minutes of anodic etching before placing under 850° C. for 90 seconds for rapid thermal oxidation. Improved porous silicon photodetector's photo-current is as shown in FIG. 3. Under 10 volts of reversed bias voltage, and under a 22.4 mW/cm$^2$ tungsten light illumination, the photo-current increases from 2.1 mA to 26.6 mA. Yet, rapid thermal oxidation also increase the dark-current of the porous silicon photodetector as shown in the inset of FIG. 3. Under 10 volts of reversed bias voltage, the dark-current increases from 28.2 $\mu$A to 701.2 $\mu$A. The main reason is that after rapid thermal oxidation, a nonstoichiometric silicon oxide structure is created which has a type of tunneling centers.

To reduce the aforementioned dark-current, this invention further discloses a rapid thermal annealing technique, which entails applying on the common formation of porous silicon photodetector, 20 mA/cm$^2$ current density, with 5% hydrofluoric acid for 15 minutes anodic etching and under 850° C. for 90 seconds to conduct rapid thermal oxidation, and then 850° C. of rapid thermal annealing for 15 seconds to improve nonstoichiometric silicon oxide structure; the condition is as shown in FIG. 4. Under optimal conditions and under a 22.4 mW/cm$^2$ tungsten light illumination, the photo-current could reach 21 mA, and at 10 volts of reversed bias voltage, the dark-current could be reduced to 5.4 $\mu$A.

Under reverse bias voltage, a porous silicon photodetector that has been treated with rapid thermal oxidation and rapid thermal annealing has an excellent photo-current response, and very low dark-current. Yet, FIG. 4 still indicates that at zero bias voltage, the photo-current response is very low; failure to improve this situation may still be sufficient to jeopardize the applicability of porous silicon photodetector.

It is found upon analyses that, for porous silicon photodetector that has been treated with rapid thermal oxidation and rapid thermal annealing, the oxidized layer's thickness is merely about 50 Å. When photo-current transmits to the metal grid, it has to pass through the oxidized layer by the tunneling effect. If the oxidized layer induces a low tunneling efficiency, the photo-current will also be reduced. In the meantime, the voltage drop of the photo-current on the oxidized layer will also cause the open-circuit voltage to drop. Therefore, hydrofluoric acid was used to remove the oxidized layer on porous silicon surface under the metal grid means. The mask used on the metal grid of a porous silicon photodetector is taken as the etching mask, while Shipley MA1300 is used as a photoresist, with 5% hydrofluoric acid to remove the oxidized layer on the porous silicon surface under the metal grid to improve the porous silicon photodetector's short-circuit photo-current and open-circuit voltage under zero bias voltage. The results of using four different intervals in removing the oxidized layer, (i) 0 second, (ii) 30 seconds, (iii) 50 seconds, and (iv) 70 seconds, the short-circuit current and open-circuit voltage at zero bias voltage is shown in FIG. 5. Under 70 seconds removing the oxidized layer and under a 22.4 mW/cm$^2$ tungsten lamp illumination, the photo-current increases to 4 mA, and the open-circuit voltage increases to 0.52 volts.

In conclusion, this invention for a technique used to improve the stability of a porous silicon photodetector by utilizing rapid thermal oxidation and rapid thermal annealing to improve the stability of porous silicon photodetector, enhances porous silicon photodetector's photo-current and light sensitivity, and reduces the photodetector's dark-current at the same time. In addition, hydrofluoric acid is used to remove the oxidized layer on the porous silicon surface under the metal grid, which may improve the photo-current response of the porous silicon photodetector at zero bias voltage to widen the application of a porous silicon photodetector. Furthermore, from the fourth quadrant curve in FIG. 5, fill factor of 0.43 can be obtained, thus the technique proposed by this invention could also be utilized in solar cells.

The invention being thus described, it will be obvious the same may be varied in many ways. Such variations are not to be regarded as a departure from the spirit and scope of the invention, and all such modifications as would be obvious to one skilled in the art are intended to be included within the scope of the following claims.

What is claimed is:

1. A manufacturing method for a porous silicon photodetector, comprising the steps of:

utilizing rapid thermal oxidation to increase the life time of carriers so as to improve the photo-current and light sensitivity of a porous silicon photodetector;

utilizing rapid thermal annealing to achieve increased photo-current response of the porous silicon photodetector, and a dark-current decreased; and with a metal mask, using hydrofluoric acid to remove the porous silicon photodetector's oxidized layer on the porous silicon surface under a metal grid to further improve the porous silicon photodetector's photo-current response at zero bias voltage.

2. The manufacturing method claimed in claim 1, where the process further comprises the steps of, cleaning a silicon wafer and coating its back with aluminum plating; upon annealing, an ohmic contact is formed before applying black wax as a protection; and to form the porous silicon, 20 mA/cm$^2$ current density, plus 5% hydrofluoric acid by volume is deployed with 15 minutes of anodic etching time before the black wax is removed; the water is then placed under 750~900° C. for 10~120 seconds for the rapid thermal oxidation, and then the rapid thermal annealing at 750~900° C. for 5~90 seconds;

wherein a wet etching technique is utilized by using the same mask of the metal grid of the porous silicon photodetector, deploying a photoresist, with 5% hydrofluoric acid by volume used in the range of 0~70 seconds to remove the porous silicon photodetector's oxidized layer from the porous silicon surface under the metal grid;

the front side of the silicon wafer is coated with aluminum; and the resulting structure is cut to a size of 5×5 cm$^2$, and sealed to complete the porous silicon photodetector.

3. The manufacturing method claimed in claim 2, wherein the process is placed under 850° C. for 90 seconds for rapid thermal oxidation, and then rapid thermal annealing at 850° C. for 15 seconds.

4. The manufacturing method claimed in claim 2, wherein the wet etching technique is utilized by using the same mask of the metal grid of the porous silicon photodetector, and a light-resistant agent is deployed, with 5% hydrofluoric acid by volume used in the range of 50~70 seconds to remove the porous silicon photodetector's oxidized layer from the porous silicon surface under the metal grid.

* * * * *